(12) United States Patent
Baer

(10) Patent No.: US 8,758,506 B2
(45) Date of Patent: Jun. 24, 2014

(54) METHOD FOR PULLING A SILICON SINGLE CRYSTAL

(75) Inventor: Markus Baer, Burghausen (DE)

(73) Assignee: Siltronic AG, Munich (DE)

( * ) Notice: Subject to any disclaimer, the term of this patent is extended or adjusted under 35 U.S.C. 154(b) by 1106 days.

(21) Appl. No.: 12/724,590

(22) Filed: Mar. 16, 2010

(65) Prior Publication Data

US 2010/0316551 A1    Dec. 16, 2010

(30) Foreign Application Priority Data

Jun. 10, 2009 (DE) .................... 10 2009 024 473

(51) Int. Cl.
*C30B 15/20* (2006.01)

(52) U.S. Cl.
USPC .............. 117/13; 117/15; 117/35; 117/932

(58) Field of Classification Search
USPC ....................... 117/13, 15, 35, 932
See application file for complete search history.

(56) References Cited

U.S. PATENT DOCUMENTS

| | | | |
|---|---|---|---|
| 5,584,930 A | 12/1996 | Katsuoka et al. | |
| 5,882,397 A | 3/1999 | Iino et al. | |
| 6,372,040 B1 * | 4/2002 | Yamagishi | 117/14 |
| 6,726,764 B2 | 4/2004 | Mutti et al. | |
| 6,869,477 B2 * | 3/2005 | Haga et al. | 117/13 |
| 8,114,216 B2 * | 2/2012 | Cho et al. | 117/32 |
| 2002/0000188 A1 | 1/2002 | Weber et al. | |
| 2003/0209186 A1 | 11/2003 | Haga et al. | |
| 2007/0193501 A1 | 8/2007 | Ono et al. | |
| 2009/0293804 A1 * | 12/2009 | Taguchi et al. | 117/35 |

FOREIGN PATENT DOCUMENTS

| | | |
|---|---|---|
| EP | 1 158 075 A1 | 11/2001 |
| JP | 11180793 A | 7/1999 |
| JP | 2002-20193 A | 1/2002 |
| KR | 10-2002-0081287 | 10/2002 |
| KR | 20090078234 A | 7/2009 |

* cited by examiner

*Primary Examiner* — Bob M Kunemund
(74) *Attorney, Agent, or Firm* — Brooks Kushman P.C.

(57) ABSTRACT

The invention relates to a method for pulling a silicon single crystal from a melt which is contained in a crucible, comprising immersion of a seed crystal into the melt; crystallization of the single crystal on the seed crystal by raising the seed crystal from the melt with a crystal pull speed; widening the diameter of the single crystal to a setpoint diameter in a conical section, comprising control of the crystal pull speed in such a way as to induce a curvature inversion of a growth front of the single crystal in the conical section.

15 Claims, 3 Drawing Sheets

METHOD FOR PULLING A SILICON SINGLE CRYSTAL

CROSS-REFERENCE TO RELATED APPLICATIONS

This application claims priority to German Patent Application No. 10 2009 024 473.5 filed Jun. 10, 2009 which is herein incorporated by reference.

BACKGROUND OF THE INVENTION

1. Field of the Invention

The invention relates to a method for pulling a silicon single crystal from a melt which is contained in a crucible.

2. Background Art

In pulling a silicon single crystal from the melt, a seed crystal is immersed into the melt and raised, material of the melt being crystallized on the seed crystal to form a single crystal. After a stabilization phase, first a neck section is pulled and later a conical section is pulled, the diameter of the growing single crystal being widened to a setpoint diameter during pulling of the conical section. The melt not only contains silicon, but conventionally also one or more dopants which are intended to be incorporated in the lattice of the single crystal in order to determine the electrical conductivity of the single crystal. The melt furthermore contains oxygen, which is dissolved from the crucible material and partially incorporated into the single crystal. The oxygen contained in the single crystal has advantageous and disadvantageous effects.

Precipitates containing oxygen, i.e. so-called BMDs (bulk micro-defects), act as internal getters which can bind metallic impurities and thereby prevent them from interfering with the functions of electronic components. High oxygen concentrations, on the other hand, also promote the formation of detrimental stacking faults, so-called OSFs (oxidation-induced stacking faults). It is therefore desirable to control the oxygen concentration in the single crystal, and likewise the concentration of dopants, so that they do not depart from a narrowly specified concentration range at least in the region of the single crystal's cylindrical section which is used for the production of semiconductor wafers, has the setpoint diameter, and is adjacent to the conical section.

The oxygen concentration in the single crystal can be influenced in various ways, for example by controlling the gas pressure in the reactor, by controlling the speed with which inert gas is fed through the reactor, by controlling the distance between the melt surface and the lower end of a heat shield enclosing the single crystal, by controlling the rotation speed of the single crystal and the crucible, and by controlling the strength of a magnetic field applied to the melt. Despite the use of such control measures, there are problems in obtaining the oxygen concentration in the specified concentration range from the start, i.e. at the beginning of the cylindrical section of the single crystal. If the semiconductor wafers obtained from the start of the cylindrical section of the single crystal do not have the oxygen concentration specified by the customer, this leads to a yield loss which is commensurately more serious when the diameter of the single crystal is larger and when its cylindrical section is shorter.

SUMMARY

It is an object of the present invention to provide a method, with the aid of which such yield losses can be substantially reduced. These and other objects are achieved by a method for pulling a silicon single crystal from a melt which is contained in a crucible, comprising immersion of a seed crystal into the melt; crystallizing the single crystal on the seed crystal by raising the seed crystal from the melt with a crystal pull speed; and widening the diameter of the single crystal to a setpoint diameter in a conical section, wherein the crystal pull speed is controlled in such a way so as to induce a curvature inversion of a growth front of the single crystal in the conical section.

BRIEF DESCRIPTION OF THE DRAWINGS

The invention will be explained in more detail below with the aid of figures.

DETAILED DESCRIPTION OF THE PREFERRED EMBODIMENTS

Studies by the Inventor have revealed that particular attention must be paid to the phase during which the conical section of the single crystal is being pulled, to avoid a yield loss due to absence of the specified oxygen concentration at the start of the cylindrical section of the single crystal. It is necessary to ensure that the crystal pull speed, at which the single crystal growing on the seed crystal is pulled, is controlled in such a way that a curvature inversion of the single crystal is achieved in the conical section.

Preferably, the crystal pull speed is first reduced and subsequently increased during the phase of pulling the conical section of the single crystal.

When pulling the conical section, it is particularly preferable to reduce the crystal pull speed from an initial speed to a lower crystal pull speed which is at least 40%, preferably at least 60% less than the initial speed, and to increase it again from the lower crystal pull speed to a final speed. The final speed will be the crystal pull speed until the setpoint diameter is reached. The initial speed is also preferably higher than the final speed.

It is furthermore preferable for the seed crystal not to be raised with the lower crystal pull speed until the diameter of the conical section has reached at least 50% of the setpoint diameter.

When a single crystal is cut axially, segregation strips of dopants and oxygen reveal the profile of the growth front. The segregation strips are due to temperature variations in the melt, owing to which the concentrations of the dopants and oxygen also vary to a greater or lesser extent in the radial direction of the single crystal.

Reducing and increasing the crystal pull speed, as described above, leads to an inversion of the curvature of the growth front in the conical section. Initially, the growth front is curved concavely as seen looking toward the seed crystal. According to the invention, the change to a convex curvature of the growth front still takes place in the conical section of the single crystal owing to the control of the crystal pull rate.

Figure 1:
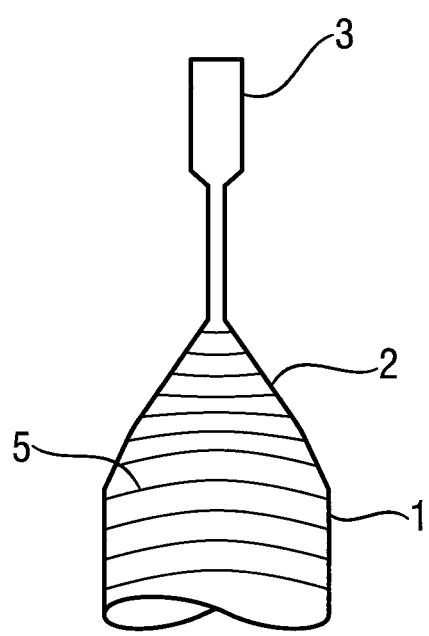
FIGS. 1 and 2 show a single crystal which has been pulled according to the invention, in the region of the conical section.

FIG. 1 represents the seed crystal 3, the conical section 2 and the start of the cylindrical section 1 of a single crystal, which has been pulled according to the invention. Between the seed crystal and the conical section, there is a neck section. The diameter of the conical section increases to the setpoint diameter, which is reached at the transition to the cylindrical section. The growth front shown by the curved segregation strips 5 is shaped in such a way that the segregation strips' curvature existing in the cylindrical section is inverted in the conical section. There is no inversion of curvature in the cylindrical section.

Figure 2:
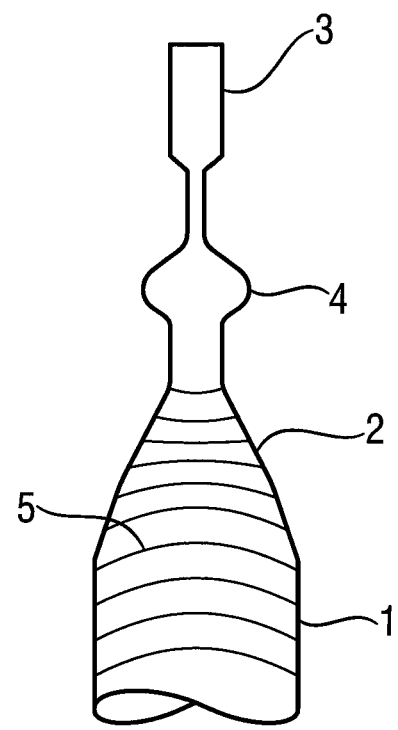

The single crystal according to FIG. 2 differs from that in FIG. 1 by a second section 4 above the conical section 2. Such thickening is generally required when pulling a single crystal which is so heavy that the seed crystal or the neck section could tear off owing to the weight load, if the single crystal is not supported by a holding system on the thickened part.

Figure 3:
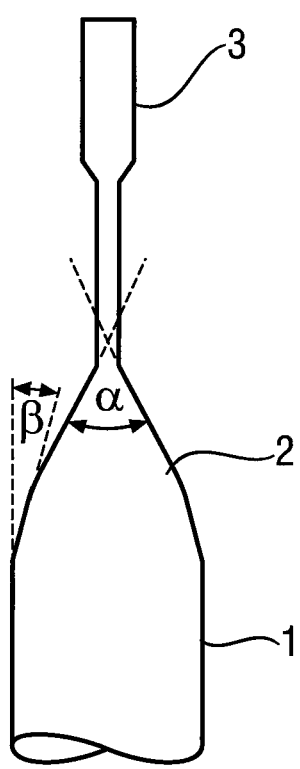
FIG. 3 shows the positions of the angles $\alpha$ and $\beta$ in the single crystal according to FIG. 1 and FIG. 2.

For carrying out the method, it is advantageous that the axial length of the conical section 2 should be longer than would be necessary in order to widen the diameter of the conical section to the setpoint diameter. The conical section therefore preferably has an apex angle $\alpha$ of not less than 60° and not more than 90°, most preferably not more than 80°. The external angle $\beta$ at the transition from the conical section 2 to the cylindrical section 1 is preferably not less than 5° and not more than 25°. The positions of the angles are represented in FIG. 3.

The typical axial length of the conical section is preferably from 160 to 220 mm for a single crystal having a nominal setpoint diameter of 200 mm, and preferably from 240 to 340 mm for a single crystal having a nominal setpoint diameter of 300 mm. In the case of single crystals having a nominal setpoint diameter of more than 300 mm, the axial length of the conical section will be correspondingly longer.

EXAMPLE

Figure 4:
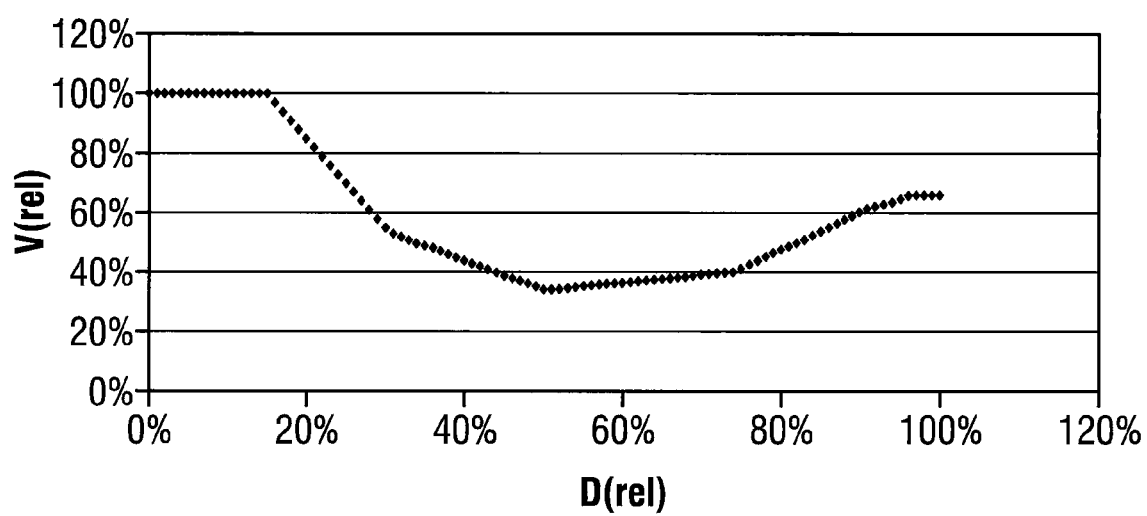
FIG. 4 shows the profile of the crystal pull speed while pulling the conical section, with reference to the example of a silicon single crystal having a setpoint diameter of 200 mm.

A silicon single crystal having a nominal setpoint diameter of 200 mm was pulled according to the invention. The profile of the crystal pull speed expressed in terms of the initial speed, i.e. V(rel), in the region of the conical section is shown in FIG. 4. The relative diameter of the conical section in relation to the setpoint diameter, i.e. D(rel), is plotted as the abscissa.

For comparison, another single crystal was pulled with the same nominal diameter but with a virtually constant crystal pull speed while pulling the conical section. In this single crystal, the region at the start of the cylindrical section did not comply with the predetermined specification with respect to the oxygen concentration. There was no such yield loss in the case of the single crystal pulled according to FIG. 4.

While exemplary embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for pulling a silicon single crystal from a silicon-containing melt which is contained in a crucible, comprising:

immersing a seed crystal into the melt;
   crystallizing a single crystal on the seed crystal by raising the seed crystal from the melt with a crystal pull speed;
   widening the diameter of the single crystal to a setpoint diameter in a conical section, wherein
   the crystal pull speed is controlled in such a way as to induce a curvature inversion of a growth front of the single crystal in the conical section.

2. The method of claim 1, comprising:

reducing the crystal pull speed from an initial speed to a lower crystal pull speed which is at least 40% less than the initial speed, and increasing the crystal pull speed from the lower crystal pull speed to a substantially constant final speed with which the seed crystal is raised until the setpoint diameter is reached.

3. The method of claim 2, wherein the final speed is less than the initial speed.

4. The method of claim 2, wherein the seed crystal is not raised with the lower crystal pull speed until the diameter of the conical section has reached at least 50% of the setpoint diameter.

5. The method of claim 3, wherein the seed crystal is not raised with the lower crystal pull speed until the diameter of the conical section has reached at least 50% of the setpoint diameter.

6. The method of claim 1, wherein an apex angle $\alpha$ of not less than 60° and not more than 90° is imparted to the conical section.

7. The method of claim 2, wherein an apex angle $\alpha$ of not less than 60° and not more than 90° is imparted to the conical section.

8. The method of claim 3, wherein an apex angle $\alpha$ of not less than 60° and not more than 90° is imparted to the conical section.

9. The method of claim 4, wherein an apex angle $\alpha$ of not less than 60° and not more than 90° is imparted to the conical section.

10. The method of claim 5, wherein an apex angle $\alpha$ of not less than 60° and not more than 90° is imparted to the conical section.

11. The method of claim 1, wherein the external angle $\beta$ at the transition from the conical section to the cylindrical section is not less than 5° and not more than 25°.

12. The method of claim 2, wherein the external angle $\beta$ at the transition from the conical section to the cylindrical section is not less than 5° and not more than 25°.

13. The method of claim 3, wherein the external angle $\beta$ at the transition from the conical section to the cylindrical section is not less than 5° and not more than 25°.

14. The method of claim 4, wherein the external angle $\beta$ at the transition from the conical section to the cylindrical section is not less than 5° and not more than 25°.

15. A silicon single crystal, produced by the method of claim 1.

* * * * *